(12) United States Patent  (10) Patent No.: US 7,796,657 B2
Mogi  (45) Date of Patent: Sep. 14, 2010

(54) OPTICAL MODULE

(75) Inventor: Masahiro Mogi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 36 days.

(21) Appl. No.: 12/394,672

(22) Filed: Feb. 27, 2009

(65) Prior Publication Data

US 2009/0219963 A1    Sep. 3, 2009

(30) Foreign Application Priority Data

Feb. 29, 2008    (JP) ............................. 2008-049060

(51) Int. Cl.
*H01S 3/04* (2006.01)
(52) U.S. Cl. ............................ 372/34; 372/35; 372/36; 372/50.1
(58) Field of Classification Search .................. 372/34, 372/35, 36
See application file for complete search history.

(56) References Cited

U.S. PATENT DOCUMENTS 5,960,142 A * 9/1999 Shimizu ...................... 385/92
6,219,364 B1 * 4/2001 Dei .............................. 372/36
6,760,352 B2 * 7/2004 Wakisaka et al. ............. 372/36

FOREIGN PATENT DOCUMENTS

JP   2003-163482   6/2003
JP   2003-168843   6/2003

* cited by examiner

*Primary Examiner*—Dung T Nguyen
(74) *Attorney, Agent, or Firm*—Staas & Halsey LLP

(57) ABSTRACT

An optical module includes a laser device, a thermal conduction member, a Peltier device disposed between the laser device and the thermal conduction member, a heat radiation part, and a variable thermal-resistance device disposed between the thermal conduction member and the heat radiation part, the variable thermal-resistance device changing a thermal resistance between the thermal conduction member and the heat radiation part according to an ambient temperature.

3 Claims, 4 Drawing Sheets

OPTICAL MODULE

CROSS-REFERENCE TO RELATED APPLICATION

This application is based upon and claims the benefit of priority of the prior Japanese Patent Application No. 2008-49060, filed on Feb. 29, 2008, the entire contents of which are incorporated herein by reference.

BACKGROUND

Various embodiments of the present invention relate to an optical module, in particular, to an optical module including a laser device.

DESCRIPTION OF THE RELATED ART

A laser device produces a laser light with a certain wavelength. The temperature of a laser device determines the wavelength of a laser light. For this reason, to stabilize the wavelength of a laser light, the temperature of a laser device should be kept constant. To keep the temperature of a laser device constant, a Peltier device is used. A Peltier device controls thermal energy transfer between a heat radiation part and a laser device. When the ambient temperature of the laser device increases, the Peltier device transfers thermal energy from the laser device to the heat radiation part. Japanese Unexamined Patent Application Publication No. 2003-168843 discloses a feature of controlling the temperature of a semiconductor laser device with a configuration in which the semiconductor laser device is connected to a heat radiation part through a material having a high thermal conductivity. Use of this configuration prevents an increase in the temperature of the laser device. Conversely, when the ambient temperature of the laser device decreases, the Peltier device transfers thermal energy from the heat radiation part to the laser device. This prevents a decrease in the temperature of the laser device. Japanese Unexamined Patent Application Publication No. 2003-163482 discloses a feature of increasing the thermal resistance between a heating unit and a heat-radiating unit by forming a gap between the installation position of the heating unit and the installation position of the heat-radiating unit, the gap being formed by thermal expansion of a columnar unit including a heater provided between the installation position of the heating unit and the installation position of the heat-radiating unit.

As disclosed in Japanese Unexamined Patent Application Publication No. 2003-168843, heat radiation parts are generally configured to radiate heat and always radiate heat. A heat radiation part radiates heat even when a laser device is required to be heated by receiving thermal energy conversely from a Peltier device, for example, during startup of the laser device. In this case, the heat radiation part decreases the heating efficiency of the laser device, thereby increasing power consumption of the Peltier device. Japanese Unexamined Patent Application Publication No. 2003-163482 discloses a feature of increasing the thermal resistance between a heating unit and a heat-radiating unit by thermal expansion of a columnar unit, the thermal expansion being caused by heat generated from a heater provided as heating means. Unfortunately, this feature requires an additional mechanism specifically designed for controlling the thermal resistance and additional control means.

SUMMARY

An optical module including a laser device, a thermal conduction member, a Peltier device disposed between the laser device and the thermal conduction member, a heat radiation part, and a variable thermal-resistance device disposed between the thermal conduction member and the heat radiation part, the variable thermal-resistance device changing a thermal resistance between the thermal conduction member and the heat radiation part according to an ambient temperature.

DESCRIPTION OF THE EMBODIMENTS

Hereinafter, an embodiment of the present invention is described with reference to attached drawings.

Figure 1:
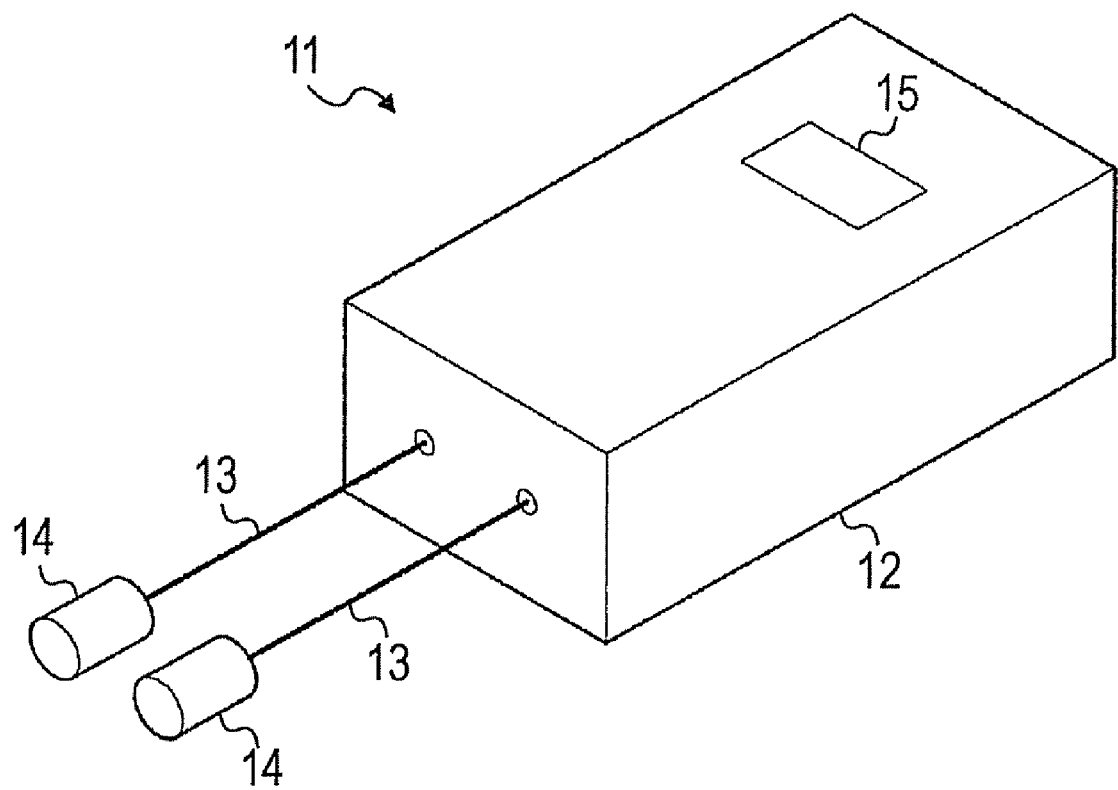
FIG. 1 is a perspective view schematically illustrating an outer appearance of an optical transmitter receiver module according to an embodiment of the present invention.

FIG. 1 schematically illustrates an optical transmitter receiver module 11 according to an embodiment of the present invention. The optical transmitter receiver module 11 includes a housing 12. The inner space of the housing 12 is partitioned into, for example, rectangular parallelepiped spaces. Ends of a pair of optical fibers 13 are connected to the housing 12. The other ends of the optical fibers 13 are connected to optical connectors 14. A connector 15 is embedded into the top plate of the housing 12. The connector 15 is bonded to a corresponding connector (not illustrated). The connector 15 and the corresponding connector are electrically connected.

Figure 2:
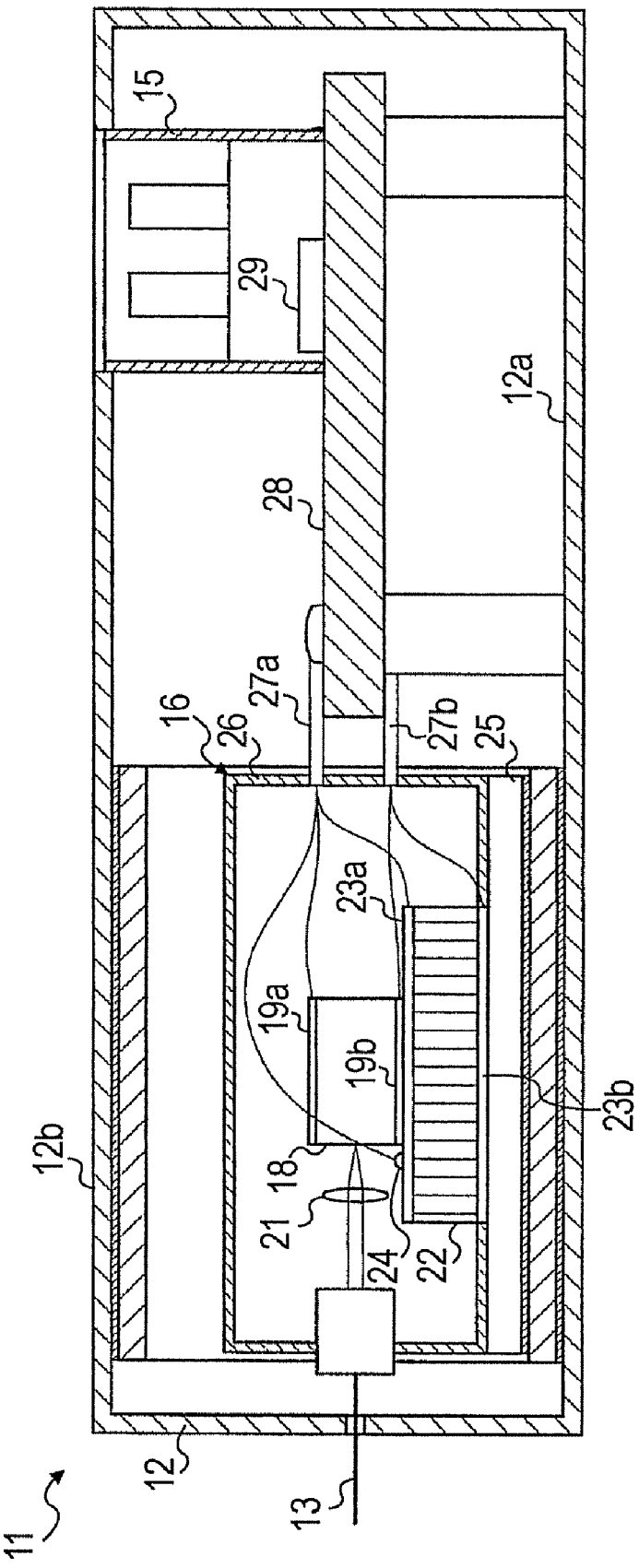
FIG. 2 is an enlarged vertical section view schematically illustrating the configuration of an optical transmitter subassembly in the optical transmitter receiver module.

As illustrated in FIG. 2, the housing 12 houses an optical transmitter subassembly 16. One of the optical fibers 13 is connected to the optical transmitter subassembly 16 through a wall plate of the housing 12. Optical signals output from the optical transmitter subassembly 16 are transferred to outside of the housing 12 via the optical fiber 13. The optical transmitter receiver module 11 outputs binary signals in accordance with driving signals.

The optical transmitter subassembly 16 includes a laser device 18. The laser device 18 is sandwiched between a pair of electrodes 19a and 19b in the vertical direction. Application of a voltage across the electrodes 19a and 19b causes a current to flow through the laser device 18. The current causes excitation of the laser device 18, so that the laser device 18 emits a laser light. An electroabsorption modulator (not illustrated) is disposed in front of the laser device 18. The electroabsorption modulator and the laser device 18 are integrated to constitute a single module.

The laser device 18 and the optical fiber 13 are arranged such that the light-emitting surface of the laser device 18 faces an end of the optical fiber 13. A condenser 21 is disposed at a position between the light-emitting surface of the laser device 18 and the optical fiber 13. A laser light emitted from the laser device 18 passes through the condenser 21 to be converted into a parallel beam. The resultant parallel beam enters the optical fiber 13.

The laser device 18 is mounted on a Peltier device 22. The Peltier device 22 is sandwiched between a pair of electrodes 23a and 23b in the vertical direction. For example, a current flowing in a forward direction across the electrodes 23a and 23b causes transfer of thermal energy from the electrode 23a side to the electrode 23b. Conversely, a current flowing in a backward direction across the electrodes 23a and 23b causes transfer of thermal energy from the electrode 23b side to the electrode 23a. The electrode 19b under the laser device 18 is bonded to the upper electrode 23a. Efficient heat transfer is achieved between the laser device 18 and the Peltier device 22.

For example, a thermistor 24 is mounted on the upper electrode 23a. The thermistor 24 is disposed at a position as close as possible to the laser device 18. The thermistor 24 is configured to measure the ambient temperature of the laser device 18.

The Peltier device 22 is mounted on a thermal conduction member 25. The electrode 23b under the Peltier device 22 is bonded to a surface of the thermal conduction member 25. Efficient heat transfer is achieved between the Peltier device 22 and the thermal conduction member 25. A subassembly housing 26 is mounted on the thermal conduction member 25. The inner space of the subassembly housing 26 is sealed with the thermal conduction member 25. As a result, the laser device 18 and the Peltier device 22 are hermetically sealed within the subassembly housing 26.

A plurality of pin terminals 27a and 27b are secured to the subassembly housing 26. These pin terminals are arranged, for example, in two rows. Specifically, the pin terminals 27a of a first group are aligned horizontally. The pin terminals 27b of a second group are also aligned horizontally. In FIG. 2, only the most proximal pin terminal is illustrated for each row. The pin terminals 27a and 27b may penetrate a wall plate of the subassembly housing 26. One pin terminal 27a among the first group pin terminals 27a is connected to the output terminal of the thermistor 24. As a result, temperature signals produced in the thermistor 24 are output through the pin terminal 27a. The temperature signals represent the ambient temperature of the laser device 18. Another pin terminal 27a among the first group pin terminals and one pin terminal 27b among the second group pin terminals are respectively connected to the electrodes 19a and 19b sandwiching the laser device 18. As a result, a voltage is applied to the laser device 18 through the pair of the pin terminals 27a and 27b. In the same manner, another pin terminal 27a among the first group pin terminals and another pin terminal 27b among the second group pin terminals are respectively connected to the electrodes 23a and 23b sandwiching the Peltier device 22. As a result, a current is fed to the Peltier device 22 through the pair of the pin terminals 27a and 27b.

The pin terminals 27a and 27b are, for example, connected to a printed circuit board 28. Each of the pin terminals 27a and 27b is individually soldered to a conductive wiring pattern on the printed circuit board 28. Thus, the optical transmitter subassembly 16 is mounted to the printed circuit board 28. For example, a control circuit 29 is mounted to the printed circuit board 28. The pin terminals 27a and 27b are connected to the control circuit 29. The optical transmitter subassembly 16 is electrically connected to the connector 15. The optical transmitter subassembly 16 outputs optical signals in accordance with electric signals provided by the connector 15.

Figure 3:
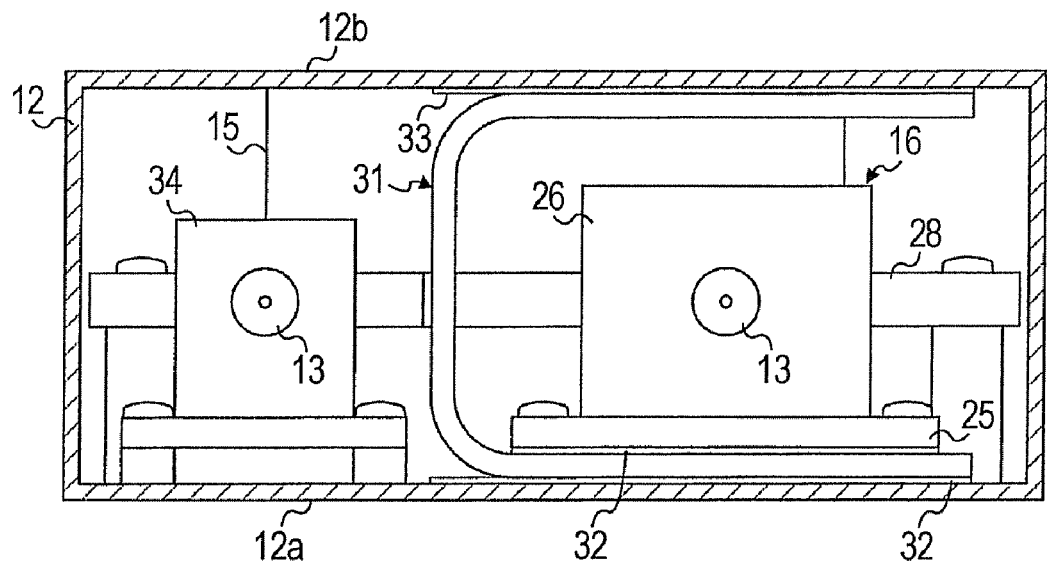
FIG. 3 is a front vertical section view schematically illustrating the optical transmitter subassembly and an optical receiver subassembly that are installed in the optical transmitter receiver module.

The thermal conduction member 25 is received by a bottom plate 12a of the housing 12. The bottom plate 12a of the housing 12 functions as a heat radiation part according to the present invention. As illustrated in FIG. 3, an end of a heat pipe 31 is disposed between the thermal conduction member 25 and the bottom plate 12a. For example, heat dissipation sheets 32 are disposed between the thermal conduction member 25 and the heat pipe 31, and between the heat pipe 31 and the bottom plate 12a. The other end of the heat pipe 31 is received by a top plate 12b of the housing 12. The top plate 12b of the housing 12 functions as an auxiliary heat radiation part according to the present invention. A heat dissipation sheet 33 is disposed between the heat pipe 31 and the top plate 12b. In this configuration, the heat pipe 31 is in contact with the bottom plate 12a and the top plate 12b of the housing 12 and the thermal conduction member 25 through large contact areas. As a result, the heat pipe 31 achieves heat transfer from the one end to the other end.

As illustrated in FIG. 3, the housing 12 contains an optical receiver subassembly 34 as well as the optical transmitter subassembly 16. The other one of the optical fibers 13 is connected to the optical receiver subassembly 34 through a wall plate of the housing 12. Optical signals fed from the outside of the housing 12 are transferred to the optical receiver subassembly 34 via the optical fiber 13. The optical transmitter receiver module 11 receives binary signals on the basis of the optical signals. The optical receiver subassembly 34 is mounted to the printed circuit board 28. Pin terminals (not illustrated) are secured to the optical receiver subassembly 34 as with the pin terminals 27a and 27b described above. The pin terminals are connected to the printed circuit board 28. Each pin terminal is individually soldered to a conductive wiring pattern on the printed circuit board 28. The optical receiver subassembly 34 is thus electrically connected to the connector 15. Electric signals are fed from the optical receiver subassembly 34 to the connector 15 in accordance with optical signals received by the optical receiver subassembly 34.

Figure 4:
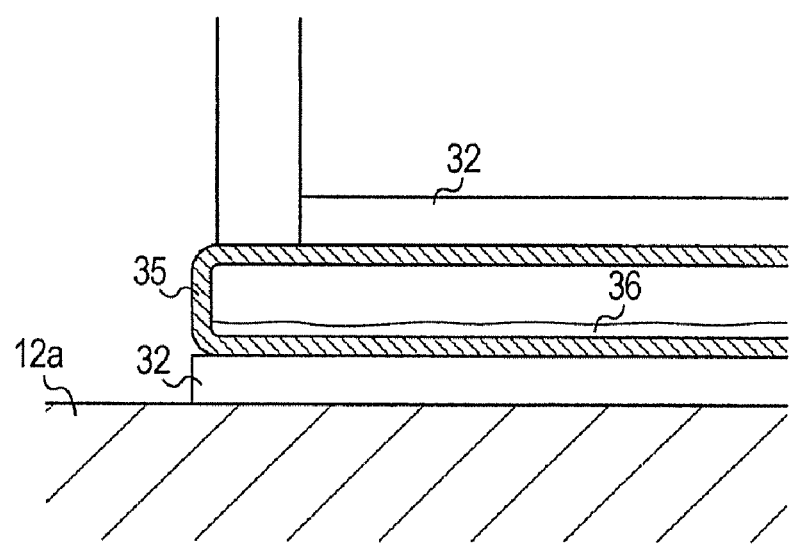
FIG. 4 is an enlarged vertical section view schematically illustrating the configuration of a heat pipe.

Referring to FIGS. 3 and 4, the heat pipe 31 includes a metal casing 35 whose one end is disposed between the thermal conduction member 25 and the bottom plate 12a of the housing 12 and whose other end is in contact with the top plate 12b of the housing 12. The metal casing 35 may be composed of a material such as stainless steel or copper. The metal casing 35 includes an airtight inner space that extends from the one end to the other end. As illustrated in FIG. 4, this inner space contains an operating fluid 36. The boiling point of the operating fluid 36 is determined in accordance with the preset temperature of the laser device 18. The wavelength of a laser light is set on the basis of this preset temperature. The boiling point of the operating fluid 36 can be adjusted by selecting the type of the operating fluid 36 or adjusting the internal pressure of the inner space. For example, when the lower limit of the operating temperature range of the heat pipe 31 is estimated to be about −10° C., a liquid having a freezing point lower than −10° C. should be used as the operating fluid 36. Examples of such a liquid may include acetone and methanol. The heat pipe 31 achieves heat transfer at a temperature equal to or more than the boiling point of the operating fluid 36. In this way, the thermal resistance between the Peltier device 22 and the housing 12 changes in accordance with the boiling point of the operating fluid 36.

Operations of the optical transmitter subassembly 16 are described below. The connector 15 feeds electric signals to the control circuit 29 on the printed circuit board 28. The electric signals are represented by binary data. The control circuit 29 applies a voltage to the laser device 18 on the basis of the data of the electric signals and, as a result, the laser device 18 emits a laser light. This laser light is converted into a parallel beam by the condenser 21. The resultant parallel beam enters the optical fiber 13.

The wavelength of a laser light emitted by the laser device 18 is fixed at a certain wavelength. To fix the wavelength of the laser light, the temperature of the laser device 18 is controlled. Assuming the case where the preset temperature of the laser device 18 is set at 39° C., the boiling point of the operating fluid 36 in the heat pipe 31 is set at 39° C. When the thermistor 24 measures a temperature of 39° C., the control circuit 29 suspends the operation of the Peltier device 22. Specifically, the control circuit 29 stops feeding of current to the Peltier device 22. As a result, the temperature of the laser device 18 is maintained and hence the wavelength of the laser light is maintained.

When the ambient temperature of the laser device 18 increases, the temperature measured by the thermistor 24 increases. The control circuit 29 receives temperature signals from the thermistor 24. The control circuit 29 feeds current to the Peltier device 22 in accordance with the measured temperature. The control circuit 29 controls the amount of current to be fed to the Peltier device 22 on the basis of a predetermined target temperature. In the control circuit 29, the amount of current required for maintaining a temperature, for example, 39° C., is determined. The control circuit 29 feeds a current to the Peltier device 22 through the electrodes 23a and 23b. According to this fed current, thermal energy is transferred from the electrode 23a side to the electrode 23b. As a result, the temperature of the laser device 18 is maintained regardless of the increase in the ambient temperature, and hence, the wavelength of the laser light emitted from the laser device 18 is maintained.

In this case, the temperature of the operating fluid 36 in the heat pipe 31 exceeds the boiling point. As a result, the heat pipe 31 achieves heat transfer as follows. Vaporization of the operating fluid 36 results in heat absorption at the one end of the heat pipe 31 and the thermal energy of the thermal conduction member 25 is transferred to the operating fluid 36. The vaporized operating fluid 36 moves from the one end to the other end in the metal casing 35. At the other end of the heat pipe 31, the thermal energy of the operating fluid 36 is transferred to the top plate 12b of the housing 12. After the thermal energy is transferred in this way, the vaporized operating fluid 36 turns into liquid again. This liquefied operating fluid 36 returns from the other end to the one end in the metal casing 35. While the heat transfer is achieved by the heat pipe 31 in this way, the thermal energy of the thermal conduction member 25 is also simply transferred to the bottom plate 12a of the housing 12 through the metal casing 35 of the heat pipe 31. In this way, the thermal energy of the thermal conduction member 25 is efficiently transferred to the housing 12. A relatively low thermal resistance is achieved from the thermal conduction member 25 to the housing 12. The bottom plate 12a and the top plate 12b of the housing 12 efficiently radiate the thermal energy to the air through the large radiation areas. Thus, the thermal conduction member 25 is efficiently cooled. As a result, the Peltier device 22 can sufficiently cool the laser device 18 with relatively low power consumption.

When the ambient temperature of the laser device 18 decreases, the temperature measured by the thermistor 24 decreases. The control circuit 29 receives temperature signals from the thermistor 24. The control circuit 29 feeds current to the Peltier device 22 in a direction opposite to the above-described direction in accordance with the measured temperature. The control circuit 29 feeds a current to the Peltier device 22 through the electrodes 23a and 23b. Thermal energy is transferred from the electrode 23b side to the electrode 23a in accordance with the current. As a result, the temperature of the laser device 18 is maintained regardless of the decrease in the ambient temperature, and hence, the wavelength of the laser light emitted from the laser device 18 is maintained.

In this case, the temperature of the operating fluid 36 in the heat pipe 31 does not reach the boiling point. Thus, the heat pipe 31 does not conduct heat transfer. As a result, the thermal energy of the thermal conduction member 25 is simply transferred to the bottom plate 12a of the housing 12 through the metal casing 35 of the heat pipe 31. The thermal energy of the thermal conduction member 25 is not transferred to the top plate 12b of the housing 12. A relatively high thermal resistance is achieved from the thermal conduction member 25 to the housing 12. Only the bottom plate 12a of the housing 12 radiates the thermal energy to the air through the relatively small radiation area. Thus, a decrease in temperature of the thermal conduction member 25 is inhibited. As a result, the Peltier device 22 can achieve efficient heat transfer from the thermal conduction member 25 to the laser device 18. Thus, the Peltier device 22 can sufficiently heat the laser device 18 with relatively low power consumption.

Figure 5:
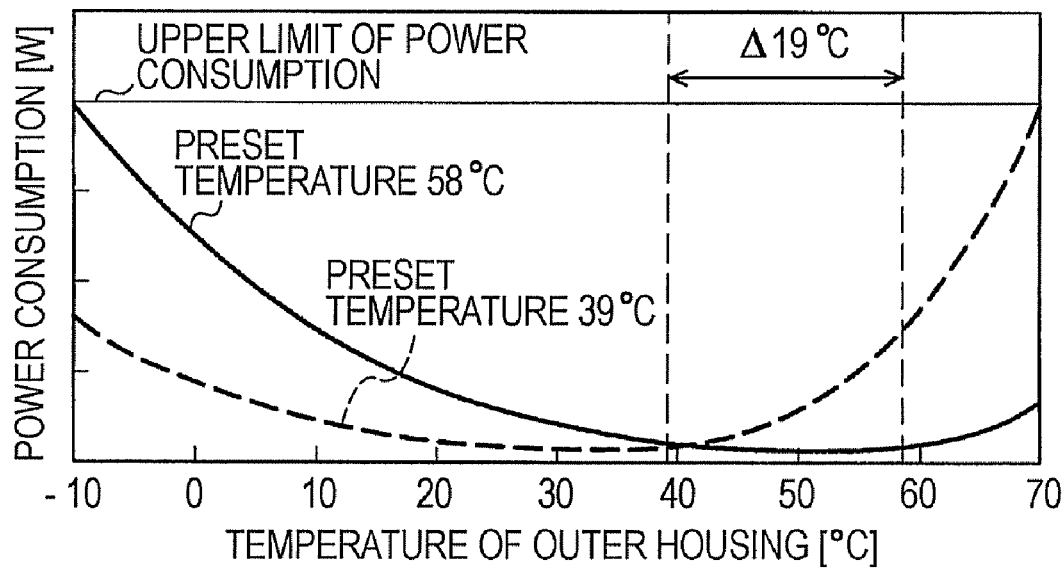
FIG. 5 is a graph illustrating the relationship between ambient temperature and power consumption in the optical transmitter subassembly according to an embodiment.

The power consumption of the Peltier device 22 is generally limited. The power consumption must not exceed the upper limit of the power consumption in the guaranteed operating temperature range of the laser device 18. For example, as illustrated in FIG. 5, when the preset temperature of the laser device 18 is set at 39° C. in accordance with the required wavelength of a laser light, the power consumption reaches the upper limit at the maximum guaranteed operating temperature (70° C.) of the laser device 18 in cooling of the laser device 18. In contrast, in heating of the laser device 18, the power consumption does not reach the upper limit at the minimum guaranteed operating temperature (−10° C.) of the laser device 18. On the other hand, when the preset temperature of the laser device 18 is set at 58° C., the power consumption reaches the upper limit at the minimum guaranteed operating temperature (−10C) of the laser device 18 in heating of the laser device 18. In contrast, in cooling of the laser device 18, the power consumption does not reach the upper limit at the maximum guaranteed operating temperature (70° C.) of the laser device 18. At this time, the temperature dependence profile of the power consumption is maintained regardless of the preset temperature of the laser device 18. Herein, the preset temperature of the laser device 18 is allowed to have a temperature margin of 19° C. Since the heat pipe 31 changes the thermal resistance between the thermal conduction member 25 and the housing 12 during heating and cooling of the laser device 18, the power consumption of the Peltier device 22 is reduced. As a result, the temperature margin of the preset temperature of the laser device 18 can be widened.

Figure 6:
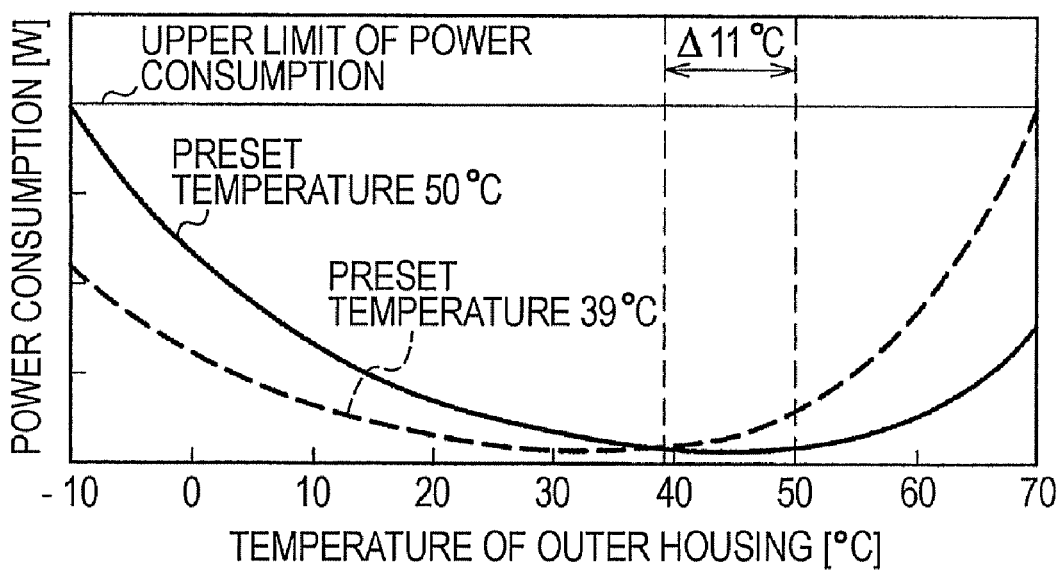
FIG. 6 is a graph illustrating the relationship between ambient temperature and power consumption in an existing optical transmitter subassembly.

Herein, assume an existing case where the heat pipe 31 is not provided for the laser device 18. As illustrated in FIG. 6, when the preset temperature of the laser device 18 is set at 39° C., the power consumption reaches the upper limit at the maximum guaranteed operating temperature (70° C.) of the laser device 18 in cooling of the laser device 18. Herein, as described above, the temperature dependence profile of the power consumption is maintained regardless of the preset temperature of the laser device 18. Thus, when the preset temperature of the laser device 18 is 50° C., the power consumption reaches the upper limit at the minimum guaranteed operating temperature (−10° C.) of the laser device 18 in heating of the laser device 18. In summary, in this existing case, the preset temperature of the laser device 18 is allowed to have a temperature margin of only 11° C. For example, when the wavelength of a laser light emitted from the laser device 18 changes by 100 pm per 1° C., an allowable temperature margin of 8° C. for the preset temperature of the laser device 18 permits adjustment of the wavelength of a laser light within the margin of 800 pm.

In the optical transmitter subassembly 16 described above, Heatlane (trademark) may also be used instead of the heat pipe. The optical transmitter subassembly 16 may also be incorporated solely in an optical transmitter module.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. An optical module comprising:
    a laser device;
    a thermal conduction member;
    a Peltier device disposed between the laser device and the thermal conduction member;
    a heat radiation part; and
    a variable thermal-resistance device disposed between the thermal conduction member and the heat radiation part, the variable thermal-resistance device changing a thermal resistance between the thermal conduction member and the heat radiation part according to an ambient temperature.

2. The optical module according to claim 1, wherein one end of the variable thermal-resistance device is disposed between the thermal conduction member and the heat radiation part and the other end of the variable thermal-resistance device is in contact with an auxiliary heat radiation part, the variable thermal-resistance device including a metal casing including an airtight inner space and an operating fluid contained in the inner space of the metal casing, the operating fluid transferring heat from one end to the other end of the metal casing by vaporization of the operating fluid.

3. The optical module according to claim 2, wherein the heat radiation part and the auxiliary heat radiation part are each constituted by a wall of an outer housing containing the laser device, the thermal conduction member, the Peltier device, and the variable thermal-resistance device.

* * * * *